United States Patent
King

(10) Patent No.: US 9,547,826 B2
(45) Date of Patent: *Jan. 17, 2017

(54) SYSTEMS AND DEVICES FOR QUANTUM PROCESSOR ARCHITECTURES

(71) Applicant: D-Wave Systems Inc., Burnaby (CA)

(72) Inventor: Andrew Douglas King, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/863,045

(22) Filed: Sep. 23, 2015

(65) Prior Publication Data

US 2016/0012347 A1  Jan. 14, 2016

Related U.S. Application Data

(63) Continuation of application No. 14/453,883, filed on Aug. 7, 2014, now Pat. No. 9,183,508.

(60) Provisional application No. 61/863,360, filed on Aug. 7, 2013.

(51) Int. Cl.
*G06N 99/00* (2010.01)
*G06F 15/76* (2006.01)
*H03K 19/195* (2006.01)

(52) U.S. Cl.
CPC ............ *G06N 99/002* (2013.01); *G06F 15/76* (2013.01); *H03K 19/195* (2013.01)

(58) Field of Classification Search
CPC ........ G06N 99/002; G06N 5/02; G06N 7/005; G06F 21/79; G06F 21/86; G06F 2221/2129; G06F 12/0866; G06F 15/76; G06F 1/1626; G06F 2212/2022; G06F 19/706; G06F 7/57; G06F 9/226; G06F 9/265; G06F 9/30094; G06F 9/30101; G06F 9/388

See application file for complete search history.

(56) References Cited

U.S. PATENT DOCUMENTS

| | | |
|---|---|---|
| 4,280,095 A | 7/1981 | Hinton |
| 6,437,413 B1 | 8/2002 | Yamaguchi et al. |
| 6,885,325 B2 | 4/2005 | Omelyanchouk et al. |
| 6,984,846 B2 | 1/2006 | Newns et al. |
| 7,135,701 B2 | 11/2006 | Amin et al. |
| 7,418,283 B2 | 8/2008 | Amin |
| 7,453,162 B2 | 11/2008 | Freedman et al. |
| 7,533,068 B2 | 5/2009 | Maassen van den Brink et al. |
| 7,566,896 B2 | 7/2009 | Freedman et al. |
| 7,605,600 B2 | 10/2009 | Harris |
| 7,619,437 B2 | 11/2009 | Thom et al. |

(Continued)

OTHER PUBLICATIONS

Barends et al., "Coherent Josephson qubit suitable for scalable quantum integrated circuits," arXiv:1304.2322v1, Apr. 8, 2013, 10 pages.

(Continued)

*Primary Examiner* — Jany Richardson
(74) *Attorney, Agent, or Firm* — Seed IP Law Group LLP

(57) ABSTRACT

Quantum processor architectures employ unit cells tiled over an area. A unit cell may include first and second sets of qubits where each qubit in the first set crosses at least one qubit in the second set. Angular deviations between qubits in one set may allow qubits in the same set to cross one another. Each unit cell is positioned proximally adjacent at least one other unit cell. Communicatively coupling between qubits is realized through respective intra-cell and inter-cell coupling devices.

13 Claims, 5 Drawing Sheets

(56) References Cited

U.S. PATENT DOCUMENTS

| | | |
|---|---|---|
| 7,800,395 B2 | 9/2010 | Johnson et al. |
| 7,843,209 B2 | 11/2010 | Berkley |
| 7,876,248 B2 | 1/2011 | Berkley et al. |
| 7,880,529 B2 | 2/2011 | Amin |
| 7,898,282 B2 | 3/2011 | Harris et al. |
| 7,930,152 B2 | 4/2011 | Coffey et al. |
| 7,969,805 B2 | 6/2011 | Thom et al. |
| 8,008,942 B2 | 8/2011 | van den Brink et al. |
| 8,018,244 B2 | 9/2011 | Berkley |
| 8,063,657 B2 | 11/2011 | Rose |
| 8,098,179 B2 | 1/2012 | Bunyk et al. |
| 8,169,231 B2 | 5/2012 | Berkley |
| 8,174,305 B2 | 5/2012 | Harris |
| 8,190,548 B2 | 5/2012 | Choi |
| 8,195,596 B2 | 6/2012 | Rose et al. |
| 8,421,053 B2 | 4/2013 | Bunyk et al. |
| 8,772,759 B2 | 7/2014 | Bunyk et al. |
| 2011/0089405 A1 | 4/2011 | Ladizinsky et al. |
| 2012/0094838 A1 | 4/2012 | Bunyk et al. |
| 2014/0097405 A1 | 4/2014 | Bunyk |
| 2014/0264283 A1 | 9/2014 | Gambetta et al. |

OTHER PUBLICATIONS

Berggren, "Quantum Computing With Superconductors," *Proceedings of the IEEE* 92(10):1630-1638, Oct. 2004.

Blatter et al., "Design aspects of superconducting-phase quantum bits," *Physical Review B* 63(174511):1-9, 2001.

Bocko et al., "Prospects for Quantum Coherent Computation Using Superconducting Electronics," *IEEE Transactions on Applied Superconductivity* 7(2):3638-3641, Jun. 1997.

Bunyk et al., "Architectural considerations in the design of a superconducting quantum annealing processor," arXiv:1401.5504v1, Jan. 21, 2014, 9 pages.

Bunyk, "Quantum Processor With Instance Programmable Qubit Connectivity," U.S. Appl. No. 61/983,370, filed Apr. 23, 2014, 53 pages.

Carelli et al., "SQUID Systems for Macroscopic Quantum Coherence and Quantum Computing," *IEEE Transactions on Applied Superconductivity* 11(1):210-214, Mar. 2001.

Chen et al., "Qubit architecture with high coherence and fast tunable coupling," arXiv:1402.7367v1, Feb. 28, 2014, 10 pages.

Clarke et al., "Superconducting quantum bits," *Nature* 453:1031-1042, Jun. 19, 2008.

Devoret et al., "Superconducting Circuits for Quantum Information: An Outlook," *Science* 339:1169-1174, Mar. 8, 2013.

Devoret et al., "Superconducting Qubits: A Short Review," arXiv:cond-mat/0411174v1, Nov. 7, 2004, 41 pages.

Friedman et al., "Quantum superposition of distinct macroscopic states," *Nature* 406:43-46, Jul. 6, 2000.

Il'ichev et al., "Continuous Monitoring of Rabi Oscillations in a Josephson Flux Qubit," *Physical Review Letters* 91(9):1-4, 2003.

Istrail, "Statistical Mechanics, Three-Dimensionality and NP-completeness—I. Universality of Intractability for the Partition Function of the Ising Model Across Non-Planar Lattices," Proceedings of the $32^{nd}$ Annual ACM Symposium on Theory of Computing, 2000, pp. 87-96.

Katzgraber et al., "Glassy Chimeras Could Be Blind to Quantum Speedup: Designing Better Benchmarks for Quantum Annealing Machines," arXiv:1401.1546v3, Apr. 11, 2014, 8 pages.

King, "Systems and Devices for Quantum Processor Architectures," U.S. Appl. No. 61/863,360, filed Aug. 7, 2013, 37 pages.

Maassen van den Brink et al., "Mediated tunable coupling of flux qubits," arXiv:cond-mat/0501148v2, Oct. 13, 2005, 16 pages.

Makhlin et al., "Quantum-state engineering with Josephson-junction devices," *Reviews of Modern Physics* 73(2):357-400, Apr. 2001.

Martinis, "Superconducting phase qubits," *Quantum Inf Process* 8:81-103, 2009.

Mooij et al., "Josephson Persistent-Current Qubit," *Science* 285:1036-1039, Aug. 13, 1999.

Orlando et al., "Superconducting persistent-current qubit," *Physical Review B* 60(22):15398-15413, Dec. 1, 1999.

Shin et al., "How "Quantum" is the D-Wave Machine?" arXiv:1401.7087v2, May 2, 2014, 8 pages.

Steffen et al., "Quantum computing: An IBM perspective," *IBM Journal of Research and Development* 55(5):13:1-13:11, Sep./Oct. 2011.

Wendin et al., "Superconducting Quantum Circuits, Qubits and Computing," arXiv:cond-mat/0508729v1, Aug. 30, 2005, 60 pages.

Zagoskin et al., "Superconducting qubits," arXiv:0805.0164v1, May 1, 2008, 34 pages.

SYSTEMS AND DEVICES FOR QUANTUM PROCESSOR ARCHITECTURES

BACKGROUND

Field

This disclosure generally relates to designs, layouts, and architectures for quantum processors comprising qubits.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is given by:

$$H_e = (1-s)H_i + sH_f$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the evolution coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can be excited to a higher energy state, such as the first excited state. In the present systems and devices, an "adiabatic" evolution is considered to be an evolution that satisfies the adiabatic condition:

$$\dot{s}|\langle 1|dH_e/ds|0\rangle| = \delta g^2(s)$$

where $\dot{s}$ is the time derivative of s, g(s) is the difference in energy between the ground state and first excited state of the system (also referred to herein as the "gap size") as a function of s, and δ is a coefficient much less than 1. Generally the initial Hamiltonian $H_i$ and the final Hamiltonian $H_f$ don't commute. That is, $[H_i, H_f] \neq 0$.

The evolution process in adiabatic quantum computing may sometimes be referred to as annealing. The rate that s changes, sometimes referred to as an evolution or annealing schedule, is normally slow enough that the system is always in the instantaneous ground state of the evolution Hamiltonian during the evolution, and transitions at anti-crossings (i.e., when the gap size is smallest) are avoided. Further details on adiabatic quantum computing systems, methods, and apparatus are described in, for example, U.S. Pat. Nos. 7,135,701 and 7,418,283.

Quantum Annealing

Quantum annealing is a computation method that may be used to find a low-energy state, typically preferably the ground state, of a system. Somewhat similar in concept to classical annealing, the method relies on the underlying principle that natural systems tend towards lower energy states because lower energy states are more stable. However, while classical annealing uses classical thermal fluctuations to guide a system to its global energy minimum, quantum annealing may use quantum effects, such as quantum tunneling, to reach a global energy minimum more accurately and/or more quickly than classical annealing. In quantum annealing thermal effects and other noise may be present to aid the annealing. However, the final low-energy state may not be the global energy minimum. Adiabatic quantum computation, therefore, may be considered a special case of quantum annealing for which the system, ideally, begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of disorder during the annealing process. The optimization problem is encoded in a Hamiltonian $H_P$, and the algorithm introduces strong quantum fluctuations by adding a disordering Hamiltonian $H_D$ that does not commute with $H_P$. An example case is:

$$H_E \propto A(t)H_D + B(t)H_P,$$

where A(t) and B(t) are time dependent envelope functions. The Hamiltonian $H_E$ may be thought of as an evolution Hamiltonian similar to $H_e$ described in the context of adiabatic quantum computation above. The disorder may be removed by removing $H_D$ (i.e., reducing A(t)). The disorder may be added and then removed. Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system will typically settle in the global minimum (i.e., the exact solution), or in a local minimum close in energy to the exact solution. The performance of the computation may be assessed via the residual energy (difference from exact solution using the objective function) versus evolution time. The computation time is the time required to generate a residual energy below some acceptable threshold value. In quantum annealing, $H_P$ may encode an optimization problem but the system does not necessarily stay in the ground state at all times. The energy landscape of Hp may be crafted so that its global minimum is the answer to the problem to be solved, and low-lying local minima are good approximations.

Quantum Processor

A quantum processor may take the form of a superconducting quantum processor. A superconducting quantum processor may include a number of qubits and associated local bias devices, for instance two or more superconducting qubits. A superconducting quantum processor may also employ coupling devices (i.e., "couplers") providing communicative coupling between qubits. A qubit and a coupler resemble each other but differ in physical parameters. One difference is the parameter, β. Consider an rf-SQUID, superconducting loop interrupted by a Josephson junction, β is the ratio of the inductance of the Josephson junction to the geometrical inductance of the loop. A design with lower values of β, about 1, behaves more like a simple inductive loop, a monostable device. A design with higher values is more dominated by the Josephson junctions, and is more likely to have bistable behavior. The parameter, β is defined a $2\pi LI_c/\Phi_0$. That is, β is proportional to the product of inductance and critical current. One can vary the inductance, for example, a qubit is normally larger than its associated coupler. The larger device has a larger inductance and thus the qubit is often a bistable device and a coupler monostable. Alternatively the critical current can be varied, or the product of the critical current and inductance can be varied. A qubit often will have more devices associated with it.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

The types of problems that may be solved by any particular embodiment of a quantum processor, as well as the relative size and complexity of such problems, typically depend on many factors. Two such factors may include the number of qubits in the quantum processor and the connectivity (i.e., the availability of communicative couplings) between the qubits in the quantum processor.

Throughout this specification, the term "connectivity" is used to describe the maximum number of possible communicative coupling paths that are physically available (e.g., whether active or not) to communicably couple between individual qubits in a quantum processor without the use of intervening qubits. For example, a qubit with a connectivity of three is capable of directly communicably coupling to up to three other qubits without any intervening qubits. In other words, there are direct communicative coupling paths available to three other qubits, although in any particular application, all or less than all of those communicative coupling paths may be employed. In a quantum processor employing coupling devices between qubits, this would mean a qubit having a connectivity of three is selectively communicably coupleable to each of three other qubits via a respective one of three coupling devices. Typically, the number of qubits in a quantum processor limits the size of problems that may be solved and the interaction between the qubits in a quantum processor limits the complexity of the problems that may be solved.

U.S. Pat. No. 8,421,053 describes a quantum processor with qubits laid out into an architecture of unit cells including bipartite graphs, such as, $K_{4,4}$. In such an example, each qubit may communicatively couple to at least four other qubits. Some qubits in the architecture may have a physical connectivity of six. Depending on the available number of qubits and their interaction, problems of various sizes may be embedded into the quantum processor.

BRIEF SUMMARY

The fixed architecture described in U.S. Pat. No. 8,421,053 is strongly coupled to qubits within each unit cell. However, the architecture offers limited interaction between unit cells. Therefore, it may very well be able to solve a certain set of problems while some other problems may benefit from altering the architecture of the qubits laid out on the quantum processor such that different qubit interconnections may be realized between adjacent unit cells of qubits. There is a growing need for new quantum processor architectures to better embed certain problem instances that may otherwise be difficult to solve using the existing architecture.

A quantum processor may be summarized as including a plurality of unit cells tiled over an area such that each unit cell may be positioned adjacent at least one other unit cell, each unit cell comprising: a first set of qubits and a second set of qubits, wherein each qubit in the first set of qubits may cross at least one qubit in the second set of qubits and at least one qubit in the first set of qubits may cross at least one qubit in the same set of qubits; and a first set of intra-cell coupling devices, wherein each coupling device in the first set of intra-cell coupling devices may be positioned proximate a respective point where a qubit in the first set of qubits may cross a qubit in the second set of qubits and provides controllable communicative coupling between the qubit in the first set of qubits and the qubit in the second set of qubits; a second set of intra-cell coupling devices, wherein each coupling device in the second set of intra-cell coupling devices may be positioned proximate a respective point for each at least one qubit in the first set of qubits may cross the at least one qubit in the same set of qubits and provides controllable communicative coupling between the at least one qubit in the first set of qubits and the at least one qubit in the same set of qubits; and the quantum processor further comprising: a set of inter-cell coupling devices, wherein each inter-cell coupling device in the set of inter-cell coupling devices may be positioned between a pair of qubits in adjacent unit cells and provides controllable communicative coupling between the pair of qubits in adjacent unit cells. The quantum processor may comprise a multi-layered integrated circuit. The quantum processor of may comprise a superconducting quantum processor and the multi-layered integrated circuit may comprise a multi-layered superconducting integrated circuit. Each qubit may comprise a loop of superconducting material interrupted by at least one Josephson junction. Each coupling device may comprise a loop of superconducting material interrupted by at least one Josephson junction. A first portion of each loop of superconducting material may be elongated along a respective longitudinal axis and, in each unit cell: the respective longitudinal axis of the first portion of each qubit in the first set of qubits may be parallel to the respective longitudinal axis of the first portion of each of the other qubits in the first set of qubits and the respective longitudinal axis of the first portion of each qubit in the second set of qubits may be parallel to the respective longitudinal axis of the first portion of each of the other qubits in the second set of qubits. In each unit cell: the respective longitudinal axis of the first portion of each qubit in the first set of qubits may be perpendicular to the respective longitudinal axis of the first portion of each qubit in the second set of qubits such that each qubit in the first set of qubits may perpendicularly cross at least one qubit in the second set of qubits.

The quantum processor may further include a second portion of the at least one loop of superconducting material arranged at an angular deviation to the first portion of the at least one loop of superconducting material and, wherein in each unit cell the second portion of at least one qubit in the first set of qubits may cross the second portion of at least one other qubit in the same set of qubits.

In each unit cell the first set of qubits may include at least four qubits and the second set of qubits may include at least four qubits, such that the unit cell includes at least eight qubits.

Each unit cell may be positioned horizontally adjacent, vertically adjacent, and/or diagonally adjacent at least one other unit cell. Each unit cell may be positioned adjacent at least three other unit cells such that each unit cell is positioned horizontally adjacent at least one other unit cell, vertically adjacent at least one other cell, and diagonally adjacent at least one other cell.

In each unit cell at least a portion of each qubit in the first set of qubits may be carried in a first layer and at least a portion of each qubit in the second set of qubits may be carried in a second layer, such that at each respective point where a qubit in the first set of qubits crosses a qubit in the second set of qubits, the qubit in the first set of qubits and the qubit in the second set of qubits are in different layers.

In each unit cell at least a portion of each intra-cell coupling device and/or at least a portion of each inter-cell coupling device may be carried in the second layer and at least a portion of each intra-cell coupling device and/or at least a portion of each inter-cell coupling device may be carried in a third layer. Furthermore, at least a portion of each qubit in the first set of qubits may be carried in the second layer and/or at least a portion of each qubit in the second set of qubits may be carried in the first layer.

A pair of qubits in adjacent unit cells may include a first qubit in the first set of qubits in a first unit cell and a second qubit in the first set of qubits in a second unit cell, wherein the second unit cell may be adjacent the first unit cell, such that at least one inter-cell coupling device may provide controllable communicative coupling between the first qubit in the first set of qubits in the first unit cell and the second qubit in the first set of qubits in the second unit cell.

A pair of qubits in adjacent unit cells may include a first qubit in the second set of qubits in a first unit cell and a second qubit in the second set of qubits in a third unit cell, wherein the third unit cell may be adjacent the first unit cell, such that at least one inter-cell coupling device may provide controllable communicative coupling between the first qubit in the second set of qubits in the first unit cell and the second qubit in the second set of qubits in the third unit cell.

A pair of qubits in adjacent unit cells may include a first qubit in the first set of qubits in a first unit cell and a second qubit in the second set of qubits in a fourth unit cell, wherein the fourth unit cell may be adjacent the first unit cell, such that at least one inter-cell coupling device provides controllable communicative coupling between the first qubit in the first set of qubits in the first unit cell and the second qubit in the second set of qubits in the fourth unit cell.

A quantum processor may be summarized as including a plurality of unit cells tiled over an area such that each unit cell is positioned adjacent at least one other unit cell, each unit cell comprising: a first set of qubits and a second set of qubits, each of the qubits of the first and the second sets of qubits having a respective major axis, the major axes of the qubits of the first set parallel with one another along at least a majority of a length thereof, and the major axes of the qubits of the second set parallel with one another along at least a majority of a length thereof, the major axes of the qubits of the second set of qubits nonparallel with the major axes of the qubits of the first set of qubits, and each qubit in the first set of qubits crosses at least one qubit in the second set of qubits and at least one qubit in the first set of qubits crosses at least one other qubit in the first set of qubits, and for each unit cell none of the qubits of the respective unit cell cross any of the respective qubits of any other one of the unit cells; a first set of intra-cell coupling devices, wherein each coupling device in the first set of intra-cell coupling devices is positioned proximate a respective point where a respective one of qubits in the first set of qubits crosses one of the qubits in the second set of qubits and provides controllable communicative coupling between the qubit in the first set of qubits and the respective qubit in the second set of qubits; and a second set of intra-cell coupling devices, wherein each coupling device in the second set of intra-cell coupling devices is positioned proximate a respective point at which each at least one qubit in the first set of qubits crosses the at least one other qubit in the first set of qubits and provides controllable communicative coupling between the at least one qubit in the first set of qubits and the at least one other qubit in the first set of qubits. The quantum processor may include a multi-layered integrated circuit. The quantum processor may include a superconducting quantum processor and the multi-layered integrated circuit comprises a multi-layered superconducting integrated circuit. The at least one qubit in the first set of qubits which crosses the at least one other qubit in the first set of qubits may have a substantially Z-shape profile. The at least one other qubit in the first set of qubits which the at least one qubit in the first set crosses may have a substantially Z-shape profile and may be a mirror image of the Z-shape profile of the at least one qubit in the first set. At least two of the qubits of the first set of qubits may each have a respective centerline that extends along the respective length of the qubit, and the centerline of the at least two of the qubits of the first set of qubits may not be straight and may cross one another. The respective major axis of each qubit in the first set of qubits may be perpendicular to the respective major axis of each qubit in the second set of qubits such that each qubit in the first set of qubits perpendicularly crosses at least one qubit in the second set of qubits. Each of at least two qubits in the first set of qubits may include an elongated loop of material that is superconductive at a critical temperature and at least one Josephson Junction that interrupts the elongated loop, the elongated loop having a pair of opposed ends and a pair of legs that extend between the pair of opposed ends along a major axis of the respective qubit and each of the ends extends across a minor axis of the respective qubit, at least one of the legs of each of the at least two qubits in the first set has a change of direction in an intermediate portion of the elongated loop, spaced away from the opposed ends, the change of direction within a layer in which at least the intermediate portion of the elongated loop resides.

The quantum may further include a set of inter-cell coupling devices, wherein each inter-cell coupling device in the set of inter-cell coupling devices is positioned between a pair of qubits in at least one adjacent unit cell and provides controllable communicative coupling between the pair of qubits in the at least one adjacent unit cell.

The quantum may further include a set of inter-cell coupling devices, wherein each inter-cell coupling device in the set of inter-cell coupling devices is positioned between a pair of qubits in at least one horizontally or vertically adjacent unit cell and provides controllable communicative coupling between the pair of qubits in the horizontally or vertically adjacent unit cells.

The quantum processor may further include a set of inter-cell coupling devices, wherein each inter-cell coupling device in the set of inter-cell coupling devices is positioned between a pair of qubits in at least one diagonally adjacent unit cell and provides controllable communicative coupling between the pair of qubits in the diagonally adjacent unit cells.

The quantum processor may further include the first set of qubits includes at least four qubits and the second set of qubits includes at least four qubits, such that the unit cell includes at least eight qubits. Each unit cell may be positioned horizontally adjacent, vertically adjacent, and/or diagonally adjacent at least one other unit cell. Each unit cell is positioned adjacent at least three other unit cells such that each unit cell is positioned horizontally adjacent at least one other unit cell, vertically adjacent at least one other cell, and diagonally adjacent at least one other cell. Each unit cell at least a portion of each qubit in the first set of qubits may be carried in a first layer and at least a portion of each qubit in the second set of qubits may be carried in a second layer, such that at each respective point where one of the qubits in the first set of qubits crosses one of the qubits in the second set of qubits, the respective qubit in the first set of qubits is in the first layer and the qubit in the second set of qubits is in the second layer, the second layer different than the first layer. In each unit cell at least a portion of each intra-cell coupling device and/or at least a portion of each inter-cell coupling device may be carried in the second layer. In each unit cell at least a portion of each intra-cell coupling device and/or at least a portion of each inter-cell coupling device may be carried in a third layer. In each unit cell at least a portion of each qubit in the first set of qubits may be carried in the second layer and/or at least a portion of each qubit in the second set of qubits may be carried in the first layer. A pair of qubits in adjacent unit cells may include a first qubit in the first set of qubits in a first unit cell and a second qubit in the first set of qubits in a second unit cell, wherein the second unit cell is adjacent the first unit cell, such that at least one inter-cell coupling device provides controllable communicative coupling between the first qubit in the first set of qubits in the first unit cell and the second qubit in the first set of qubits in the second unit cell. A pair of qubits in adjacent unit cells mi a first qubit in the second set of qubits in a first unit cell and a second qubit in the second set of qubits in a third unit cell, wherein the third unit cell is adjacent the first unit cell, such that at least one inter-cell coupling device provides controllable communicative coupling between the first qubit in the second set of qubits in the first unit cell and the second qubit in the second set of qubits in the third unit cell. A pair of qubits in adjacent unit cells may include a first qubit in the first set of qubits in a first unit cell and a second qubit in the second set of qubits in a fourth unit cell, wherein the fourth unit cell is adjacent the first unit cell, such that at least one inter-cell coupling device provides controllable communicative coupling between the first qubit in the first set of qubits in the first unit cell and the second qubit in the second set of qubits in the fourth unit cell, the second set of qubits diagonally adjacent to the first set of qubits.

A quantum processor may be summarized as including a first set of at least two qubits, each of the qubits of the first set of qubits comprising an elongated loop of material that is superconductive at a critical temperature and at least one Josephson Junction that interrupts the elongated loop, the elongated loop having a pair of opposed ends and a pair of elongated legs that extend between the pair of opposed ends along a major axis of the respective qubit, the opposed ends which extend across a minor axis of the respective qubit, the major axes of the qubits of the first set of qubit parallel to one another, and at least one of the respective elongated legs of at least one of the qubits of the first set of qubits has a change in direction within a plane of a layer in which the respective at least one elongated leg resides at a point spaced inwardly of and away from the respective pair of opposed ends; a second set of at least two qubits, each of the qubits of the second set of qubits comprising an elongated loop of material that is superconductive at a critical temperature and at least one Josephson Junction that interrupts the elongated loop, the elongated loop having a pair of opposed ends and a pair of elongated legs that extend between the pair of opposed ends along a major axis of the respective qubit, the opposed ends which extend across a minor axis of the respective qubit, the major axes of the qubits of the second set of qubit parallel to one another and nonparallel with the major axes of the qubits of the first set of qubits, and at least one of the respective elongated legs of at least one of the qubits of the second set of qubits has a least one change in direction within a plane of a layer in which the respective at least one elongated leg resides at a point spaced inwardly of and away from the respective pair of opposed ends; a first set of couplers, each of the couplers of the first set of couplers positioned to selectively directly inductively couple a respective one of the qubits of the first set of qubits with a respective one of the qubits of the second set of qubits; and a second set of couplers, each of the couplers of the second set of couplers positioned to selectively directly inductively couple a respective one of the qubits of the first set of qubits with a respective another one of the qubits of the first set of qubits.

The quantum processor may further include a third set of couplers, each of the couplers of the third set of couplers positioned to selectively directly inductively couple a respective one of the qubits of the second set of qubits with a respective another one of the qubits of the second set of qubits. One qubit of the first set of qubits may be a mirror image of the other qubit in the first set of qubits. The one qubit and the other qubit of the first set of qubits may be physically successively adjacent one another in the first set of qubits. The one qubit and the other qubit of the first set of qubits may each have a respective centerline, and the centerline of the one qubit of the first set of qubits may cross the centerline of the other qubit of the first set of qubits. The centerlines of the one and at least the other qubits of the first set of qubits may not be straight and cross one another. Each of the one qubit and the other qubit of the first set of qubits may have a Z-shape profile. One qubit of the first set of qubits may be a mirror image of the other qubit in the first set of qubits.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION OF THE INVENTION

Figure 1:
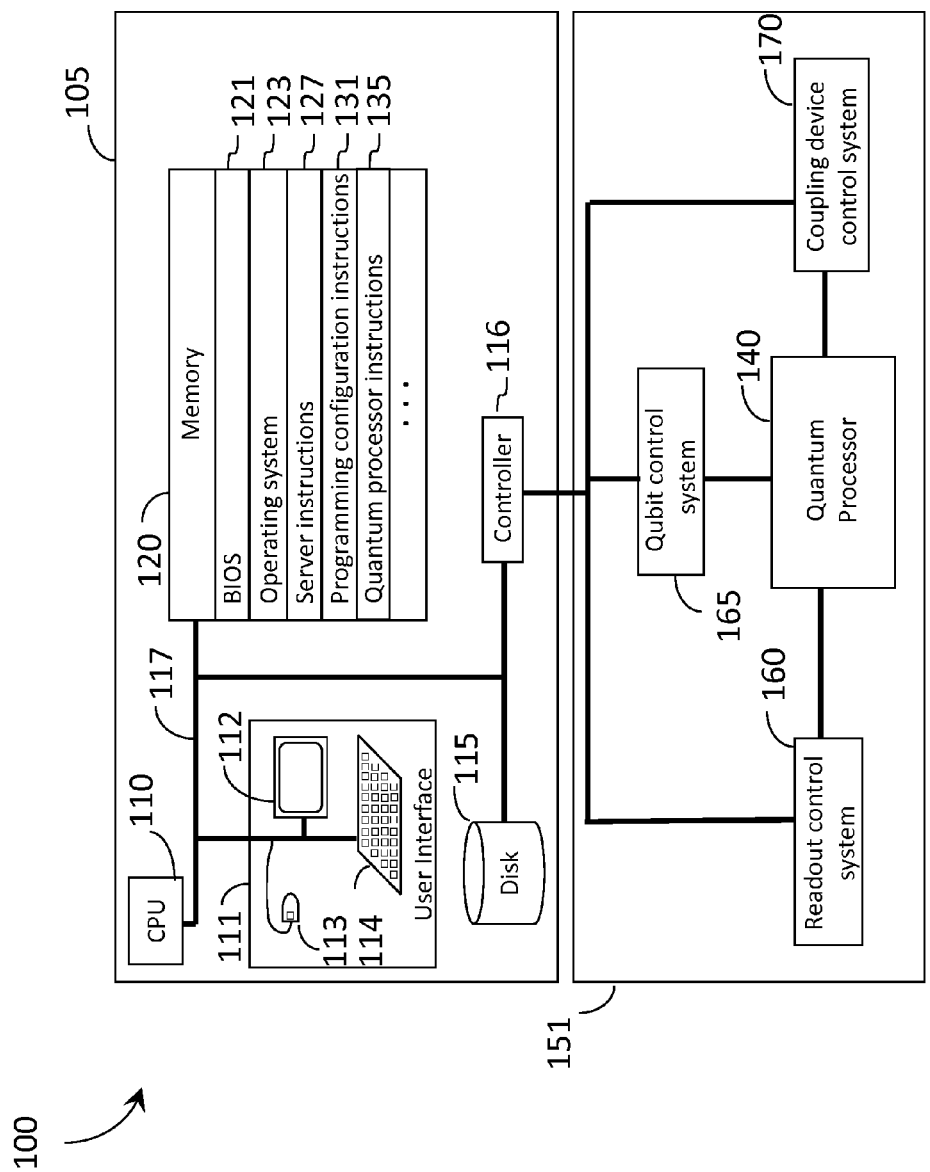
FIG. 1 is a schematic diagram of an exemplary computing system including a digital computer that may be used to perform digital processing tasks, in accordance with the present systems and devices.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with quantum processors, qubits, couplers, controller, readout devices and/or interfaces have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described herein provide systems and devices for quantum processor architectures that advantageously facilitate mapping and/or embedding for some problems and/or applications with more inter-cell qubit interconnections. For example, the present systems and devices include quantum processor architectures employing qubit interconnections that may be designed to suit the problem to be embedded into the quantum processor by altering the quantum processor architecture that may otherwise be difficult to solve via a fixed architecture such as the fixed architecture described in for example, U.S. Pat. No. 8,421,053. Throughout this specification and the appended claims, the "architecture" of a quantum processor is defined by the relative physical positions of the qubits and coupling devices ("couplers") in the quantum processor. Any given coupling device may be ON/OFF depending on the programming configuration of the quantum processor. Which couplings are ON/OFF is a configuration of the quantum processor. A programming configuration does not change the physical arrangement (i.e., the "architecture") of the qubits and coupling devices in the quantum processor. Therefore, multiple programming configurations may exist for any given architecture of a quantum processor. In other words, the architecture of a quantum processor is determined or fixed at the time of manufacture and the configuration of the quantum processor, which may correspond to a given coupling device being ON/OFF, is determined by programming the problem instance into the fixed architecture of the quantum processor.

In accordance with some embodiments of the present systems and devices, a quantum processor may be designed to perform adiabatic quantum computation and/or quantum annealing. An evolution Hamiltonian is proportional to the sum of a first term proportional to the problem Hamiltonian and a second term proportional to the disordering Hamiltonian. As previously discussed, a typical evolution may be represented by Equation (1):

$$H_E \propto A(t)H_D + B(t)H_P \qquad (1)$$

where $H_P$ is the problem Hamiltonian, disordering Hamiltonian is $H_D$, $H_E$ is the evolution or instantaneous Hamiltonian, and $A(t)$ and $B(t)$ are examples of an evolution coefficient which controls the rate of evolution. In general, evolution coefficients vary from 0 to 1. In some embodiments, a time varying envelope function is placed on the problem Hamiltonian. A common disordering Hamiltonian is shown in Equation (2):

$$H_D \propto -\frac{1}{2}\sum_{i=1}^{N} \Delta_i \sigma_i^x \qquad (2)$$

where N represents the number of qubits, $\sigma_i^x$ is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N} h_i \sigma_i^z + \sum_{j>i}^{N} J_{ij}\sigma_i^z\sigma_j^z\right] \qquad (3)$$

where N represents the number of qubits, $\sigma_i^z$ is the Pauli z-matrix for the $i^{th}$ qubit, $h_i$ and $J_{i,j}$ are dimensionless local fields for the qubits, and couplings between qubits, and $\epsilon$ is some characteristic energy scale for $H_P$. Here, the $\sigma_i^z$ and $\sigma_i^z\sigma_j^z$ terms are examples of "diagonal" terms. The former is a single qubit term and the latter a two qubit term. Throughout this specification, the terms "final Hamiltonian" and "problem Hamiltonian" are used interchangeably. Hamiltonians such as $H_D$ and $H_P$ in equations 2 and 3, respectively, may be physically realized in a variety of different ways. A particular example is realized by an implementation of superconducting qubits.

The qubits and coupling devices in a quantum processor may be arranged into an architecture such that a certain number of qubits may be laid out into a unit cell of qubits (hereinafter, "unit cell"). A unit cell is a repeated sub-portion of a quantum processor architecture comprising qubits and coupling devices. Therefore, a plurality of unit cells tiled over an area of a quantum processor produces a certain quantum processor architecture.

Each qubit in a unit cell may be included in only one unit cell such that no qubit may be included in multiple unit cells and no qubit may be shared among multiple unit cells. New quantum processor architectures according to the present systems and devices may employ different physical arrangements with respect to known arrangements, such as those described in U.S. Pat. No. 8,421,053. As used herein and in the claims, the term "cross," and variants thereof such as "crosses" or "crossing," includes "overlie," "underlie," and "overlap." Thus, "crosses" includes, for example, the situation where an outline of a portion of a first qubit on one layer or substrate is projected, for example perpendicularly, from that portion, layer or substrate and the projection intersects an outline of a respective portion of a second qubit on another layer or substrate. A unit cell may comprise of at least four qubits.

Although U.S. Pat. No. 8,421,053 describes a qubit in one unit cell as strongly coupled to at least four other qubits in the same unit cell, inter-cell interaction is limited to unit cells that may be positioned immediately adjacent (i.e., nearest neighbor) to a unit cell in the horizontal and/or vertical direction. In U.S. Pat. No. 8,421,053, no unit cells positioned immediately adjacent to a unit cell in a diagonal direction (i.e., next nearest neighbor) may interact with the unit cell. Therefore, limited interaction is realized between unit cells.

While the fixed architecture described in U.S. Pat. No. 8,421,053 may still be suitable for certain problems, certain other problem instances may benefit from new quantum processor architectures. New quantum processor architectures may include overlapping qubits in the same set of qubits in unit cells, as well as qubits that are more strongly coupled to qubits in other unit cells, resulting in a different inter-cell and intra-cell interaction.

As previously described, any given coupling may be controllable (e.g., ON/OFF) as specified by a programming configuration of the quantum processor. The programming configuration of the quantum processor may be performed by a non-quantum processor, such as a classical digital processor. A classical digital processor may be used, for example, to set the initial ON/OFF values of the couplings between pairs of qubits in a processor architecture such as the quantum processor architecture 300 of FIG. 3. Therefore, a quantum processor may interact with a digital processor in order to solve a particular problem.

FIG. 1 is a schematic diagram of an exemplary computing system 100 including a digital computer 105 that may be used to perform digital processing tasks (e.g., setting the initial ON/OFF values of the couplings between pair of qubits), in accordance with the present systems and devices. The digital computer 105 may be coupled to an analog computer 151. In some embodiments, the analog computer 151 is a quantum computer and the digital computer 105 is a classical computer. The exemplary digital computer 105 includes a digital processor that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like, when properly configured or programmed to form special purpose machines, and/or when communicatively coupled to control an analog computer, for instance a quantum computer.

Digital computer 105 will at times be referred to in the singular herein, but this is not intended to limit the application to a single digital computer. The present systems and methods can also be practiced in distributed computing environments, where tasks or sets of instructions are performed or executed by remote processing devices, which are linked through a communications network. In a distributed computing environment, sets of instruction, sometimes known as program modules, may be located in both local and remote memory storage devices.

Digital computer 105 may include at least one digital processor (such as, central processor unit 110), at least one system memory 120, and at least one system bus 117 that couples various system components, including system memory 120 to central processor unit 110.

The digital processor may be any logic processing unit, such as one or more central processing units ("CPUs"), graphics processing units ("GPUs"), digital signal processors ("DSPs"), application-specific integrated circuits ("ASICs"), field-programmable gate arrays ("FPGAs"), etc. Unless described otherwise, the construction and operation of the various blocks shown in FIG. 1 are of conventional design. As a result, such blocks need not be described in further detail herein, as they will be understood by those skilled in the relevant art.

Digital computer 105 may include a user input/output subsystem 111. In some embodiments, the user input/output subsystem includes one or more user input/output components such as a display 112, mouse 113, and/or keyboard 114. System bus 117 can employ any known bus structures or architectures, including a memory bus with a memory controller, a peripheral bus, and a local bus. System memory 120 may include non-volatile memory, such as read-only memory ("ROM"), static random access memory ("SRAM"), Flash NAND; and volatile memory such as random access memory ("RAM") (not shown). A basic input/output system ("BIOS") 121, which can form part of the ROM, contains basic routines that help transfer information between elements within digital computer 105, such as during startup.

Digital computer 105 may also include other non-volatile memory 115. Non-volatile memory 115 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 115 may communicate with digital processor via system bus 117 and may include appropriate interfaces or controllers 111 coupled to system bus 117. Non-volatile memory 115 may serve as long-term storage for computer-readable instructions, data structures, sets of processor readable instruction (also called program modules) and other data for digital computer 105.

Although digital computer 105 has been described as employing hard disks, optical disks and/or magnetic disks, those skilled in the relevant art will appreciate that other types of non-volatile computer-readable media may be employed, such a magnetic cassettes, flash memory cards, Flash, ROMs, smart cards, etc. Those skilled in the relevant art will appreciate that some computer architectures conflate volatile memory and non-volatile memory. For example, data in volatile memory can be cached to non-volatile memory. Or a solid-state disk that employs integrated circuits to provide non-volatile memory. Some computers place data traditionally stored on disk in memory. As well, some media that is traditionally regarded as volatile can have a non-volatile form, e.g., Non-Volatile Dual In-line Memory Module variation of Dual In Line Memory Modules.

Various sets of computer-or processor-readable instructions (i.e., program modules), application programs and/or data can be stored in system memory 120. For example, system memory 120 may store an operating system 123, and a set of computer-or processor-readable server instructions (i.e., server modules) 127. In some embodiments, server modules 127 includes instruction for communicating with remote clients and scheduling use of resources including resources on the digital computer 105 and analog computer 151. For example, a Web server application and/or Web client or browser application for permitting digital computer 105 to exchange data with sources via the Internet, corporate Intranets, or other networks, as well as with other server applications executing on server computers.

In some embodiments, system memory 120 may store a set of programming configuration instructions (i.e., programming configuration modules 131) to program, apply, or update the programmable elements of the quantum processor, for example, the coupling devices between qubits. In accordance with the present systems and methods, system memory 120 may store a set of analog computer interface instructions (i.e., quantum processor modules) 135 operable to interact with the analog computer 151.

While shown in FIG. 1 as being stored in system memory 120, the modules shown and other data can also be stored elsewhere including in nonvolatile memory 115.

The analog computer 151 is provided in an isolated environment (not shown). For example, where the analog computer 151 is a quantum computer, the environment shields the internal elements of the quantum computer from heat, magnetic field, and the like. The analog computer 151 includes an analog processor 140. Examples of an analog processor include quantum processors, for example, the quantum processors described herein. A quantum processor may include a quantum processor architecture, such as the quantum processor architecture 300 of FIG. 3.

As previously described, a quantum processor includes programmable elements such as qubits, couplers, and other devices. The qubits are readout via readout out system 160. These results are fed to the various sets of computer or processor readable instructions for the digital computer 105 including server modules 127, programming configuration modules 131, analog computer interface modules 135, or other modules stored in nonvolatile memory 115, returned over a network or the like. The qubits are controlled via qubit control system 115. The couplers are controlled via coupler control system 170. In some embodiments, the qubit control system 115 and the coupler control system 170 are used to implement quantum annealing as described herein on analog processor 140.

In some embodiments, the digital computer 105 can operate in a networking environment using logical connections to at least one client computer system. In some embodiments, the digital computer 105 is coupled via logical connections to at least one database system. These logical connections may be formed using any means of digital communication, for example, through a network, such as a local area network ("LAN") or a wide area network ("WAN") including, for example, the Internet. The networking environment may include wired or wireless enterprise-wide computer networks, intranets, extranets, and/or the Internet. Other embodiments may include other types of communication networks such as telecommunications networks, cellular networks, paging networks, and other mobile networks. The information sent or received via the logical connections may or may not be encrypted. When used in a LAN networking environment, digital computer 105 may be connected to the LAN through an adapter or network interface card ("NIC") (communicatively linked to system bus 117). When used in a WAN networking environment, digital computer 105 may include an interface and modem (not shown), or a device such as NIC, for establishing communications over the WAN. Non-networked communications may additionally, or alternatively, be employed. The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

Figure 2:
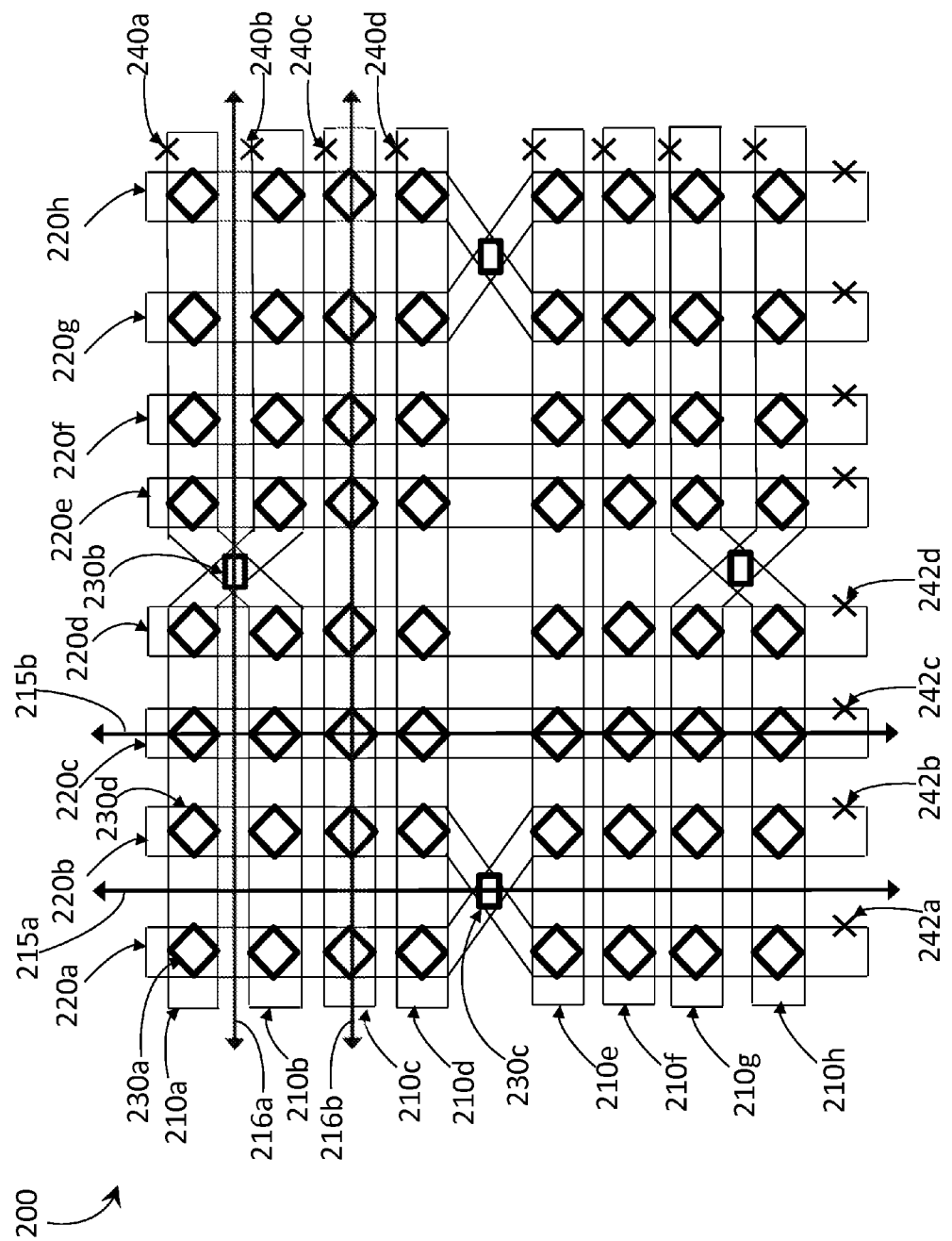
FIG. 2 is a schematic diagram of an exemplary unit cell forming the basis of a quantum processor architecture in accordance with the present systems and devices.

FIG. 2 shows an exemplary unit cell 200 forming the basis of a quantum processor architecture in accordance with the present systems and devices. Unit cell 200 includes a first set of qubits 210a-210h (collectively 210) and a second set of qubits 220a-220h (collectively 220). While each set is illustrated as having eight qubits, such is not limiting. In other implementations, each set of qubits in a unit cell may have a larger or smaller number of qubits, and the number of qubits in the second set does not need to equal the number of qubits in the first set.

The qubits 210 of the first set each have a respective longitudinal or major axis 216a, 216b (only two called out, collectively 216) along which the superconducting paths or loops of the respective qubits 210 of the first set extend in a lengthwise direction of the qubit. Likewise, the qubits 220 of the second set each have a respective longitudinal or major axis 215a, 215b (only two called out, collectively 215) along which the superconducting paths or loops of the qubits 220 of the second set extend in a lengthwise direction of the qubit. The qubits 210 of the first set have loops that are predominately or essentially parallel with one another, with the respective longitudinal or major axes 216a, 216b at least nominally parallel to each other. The qubits 220 of the second set have loops that are predominately or essentially parallel with one another, with the respective longitudinal or major axes 215a, 215b at least nominally parallel to each other.

The longitudinal or major axis is the axis along which the longest dimension of the loop of a qubit generally extends, whether or not the qubit has one or more bends or changes in directions between ends. For instance, where a loop has a Z-shaped profile the major axis ends between the top and the bottom of the Z, that is along the longest dimension or length of the loop. The qubits 210 and the qubits 220 each have respective lateral or minor axes (not shown), respectively. The lateral axis is generally perpendicular to the major axis. While the qubits are illustrated as being substantially rectangular loops, such is not intended to be limiting, and the qubits may have any other elongated form, for instance an oval. As used herein and in the claims the term essentially parallel or substantially parallel means that a longitudinal or major axis of a respective elongated loop of each of at least two qubits is parallel with one another, without reference to any relatively shorter legs or portions of the elongated loops. Another way to describe the geometric relationship between qubits in a set, is that corresponding portions of the loops of the qubits are laterally spaced equally from one another, at least except at the portion where two of the qubits cross one another. Notably, one at least one qubit 210b, 210h of the first set is a mirror image of, or has reflection symmetry with, the qubit 210a, 210g, respectively, that the qubit 210b, 210h crosses. Likewise, one at least one qubit 220d, 220h of the second set is a mirror image of, or has reflection symmetry with, the qubit 220a, 220g, respectively, that the qubit 220d, 220h crosses.

The longitudinal or major axes 216 of the qubits 210 of the first set of qubits are nonparallel (e.g., perpendicular) to the longitudinal or major axes 215 of the qubits 220 of the second set of qubits. The qubits 210 of the first set may, for instance, be laid out generally horizontally in the plane of the drawing sheet of FIG. 2, and hence are denominated herein as horizontal qubits 210 for ease of discussion. The qubits 220 of the second set may, for instance, be laid out generally vertically in the plane of the drawing sheet of FIG. 2, and hence are denominated as vertical qubits 220 for ease of discussion. While the qubits of the first set are illustrated as being perpendicular with respect to the qubits of the second set, such is not intended to be limiting. Other implementations may include other orientations between the qubits of one set with respect to the other set of qubits.

Another way to describe the geometrical relationship between qubits of a set is that the qubits 210 of the first set each have loops that principally or predominately extend along or have an axis of symmetry about a first axis 216b of a die, wafer or substrate which carries the qubits 210, the qubits 220 of the second set each have loops that principally or predominately extend along or have an axis of symmetry about a second axis 215b of a die, wafer or substrate which carries the qubits 220, the second axis 215b is non-parallel with the first axis 216b. The first axis 216b and/or the second axis 215b may or may not correspond to a geometric feature or characteristic of the die, wafer or substrate. For example, where the die, wafer or substrate has a rectangular profile or shape, the first axis 216b and the second axis 215b may be parallel to the edges of the die, wafer or substrate. Alternatively, the first axis 216b and the second axis 215b may be arbitrary but fixed axes defined on the die, wafer or substrate.

The unit cell 200 includes at least one qubit from one set of essentially parallel qubits that crosses at least one qubit from the other set of essentially parallel qubits.

As previously described, unit cell 200 represents a single unit cell in a quantum processor, whereas the corresponding quantum processor architecture may comprise a plurality of unit cells 200 tiled over an area. A complete processor architecture may employ a plurality of unit cells 200 where each individual unit cell 200 is positioned adjacent (i.e., neighboring) at least one other unit cell 200. Notably, on a single processor device or wafer, none of the loops of the qubits that comprise one unit cell cross any of the loops of the qubits that comprise any other unit cell. A person of skill in the art will appreciate that while sixteen qubits are illustrated in unit cell 200, this number is arbitrary and unit cell 200 may comprise more or fewer than sixteen qubits (but must comprise at least four qubits).

Qubits 210, 220 may be superconducting qubits. Each qubit 210a-210h may be a respective loop of superconducting material where at least a first portion of each loop of superconducting material is elongated along a respective major or longitudinal axis that extends along the horizontal axis in the plane of the drawing sheet of FIG. 2. Each qubit 210a-210h is interrupted by at least one respective Josephson junction 240a-240d (only Josephson junctions 240a-240d of respective qubits 210a-210d are called out in FIG. 2 to reduce clutter). Each qubit 210a-210h may be a respective loop of superconducting material where at least a first portion of each loop of superconducting material is elongated along a respective major or longitudinal axis that extends along the vertical axis in the plane of the drawing sheet of FIG. 2, and interrupted by at least one respective Josephson junction 242a-242d (only Josephson junctions 242a-242d of respective qubits 220a-220d are called out in FIG. 2 to reduce clutter). At least the first portion or a majority of each of horizontal qubits 210 are laid out substantially parallel to one another (i.e., respective major or longitudinal axes parallel to one another, and illustrated as parallel to the horizontal axis). At least the first portion or a majority of each of vertical qubits 220 are laid out substantially parallel to one another (i.e., respective major or longitudinal axes parallel to one another, and illustrated as parallel to the vertical axis of the drawing sheet of FIG. 2). The major or longitudinal axes of the horizontal qubits 210 are substantially perpendicular to the major or longitudinal axes of the vertical qubits 220. Each of horizontal qubits 210 are in a first set of qubits and each of vertical qubits 220 are in a second set of qubits.

Some problems may be solved by embedding the problem into a quantum processor that is well designed for embedding the particular problem. For instance, it may be advantageous to employ a fixed quantum processor architecture that is different or modified from the fixed quantum processor architecture described in, for example U.S. Pat. No. 8,421,053. Such different or modified architecture may, for instance, allow better embedding and/or solution of certain problems. With respect to the fixed quantum processor architecture described in, for example U.S. Pat. No. 8,421,053, communicatively coupling a pair of qubits in the same set of qubits of a unit cell as well as enabling communicative coupling between pairs of qubits in adjacent unit cells (for example, diagonally adjacent unit cells) may produce different or modified quantum processor architectures with different qubit interaction patterns between qubits in adjacent unit cells.

For example, in unit cell 200 illustrated in FIG. 2, a portion of qubits 220a and 220b are each arranged at an angular deviation to at least the first portion (e.g., elongated or major portions) of respective qubits 220a and 220b such that qubit 220a may cross qubit 220b. In particular, for qubits 220a and 220b, an intermediate portion extends diagonally between a first elongated or major portion and a second elongated or major portion, forming a general Z-shape, with the first and the second elongated or major portions forming the upper and lower portions of the Z, and the diagonally extending portion therebetween. (As noted below, qubits 220g and 220h have a similar structure and configuration to that of qubits 220a and 220b.) A coupling device such as coupling device 230c placed proximate the portion of qubit 220a that crosses a portion of qubit 220b may couple qubits 220a and 220b together. Similarly, qubits 210a and 210b may be communicatively coupled by coupling device 230b as a result of qubit 210a crossing qubit 210b where a second portion of qubits 210a and 210b are arranged at an angular deviation to at least the first portion (e.g., elongated or major portions) of respective qubits 210a and 210b that are laid out generally horizontally in the plane of the drawing sheet of FIG. 2. Qubits 210a and 210b are in the same set of qubits (i.e., first set of qubits) as a first portion of each qubit 210a and 210b laid out generally horizontally in the plane of the drawing sheet of FIG. 2. Similarly, qubits 220a and 220b are in the same set of qubits (i.e., second set of qubits) as a first portion of each qubit 220a and 220b laid out generally vertically.

Coupling device 230a may communicatively couple qubit 220a and 210a together where qubit 220a crosses qubit 210a. Qubit 210a may be in a first set of qubits and qubit 220a may be in a second set of qubits. Coupling device 230a may be in a first set of intra-cell coupling devices as coupling device 230a couples a pair of qubits in different sets of qubits (i.e., first and second set of qubits) in the same unit cell (i.e., unit cell 200). Similarly, coupling devices 230b, 230c that may couple pairs of qubits in the same set of qubits (i.e., either the first set or the second set) in the same unit cell may be in a second set of intra-cell coupling devices. Only coupling device 230a of the first set of intra-cell coupling devices and coupling devices 230b and 230c of the second set of intra-cell coupling devices are called out in FIG. 2 to reduce clutter. Such intra-cell coupling devices may increase the strength of coupling between qubits in the same unit cell.

As illustrated in FIG. 2, qubits 220c-220f are elongated along a respective major or longitudinal axis (e.g., substantially parallel to the vertical axis in the plane of the drawing sheet) with no angular deviation between portions except at the ends of the qubit loop, whereas a portion of each of qubits 220a, 220b, 220g and 220h are arranged at an angular deviation to the respective major or longitudinal axis of the qubits 220a, 220b, 220g and 220h, respectively. While the ends of the qubits 220c-220f are illustrated as formed by straight segments, other shapes may be employed, for instance arcuate shapes. Similarly, qubits 210c-210f are elongated along a respective major or longitudinal axis (e.g., substantially parallel to the horizontal axis in the plane of the drawing sheet) with no angular deviation between portions except at the ends of the qubit loop, whereas a portion of each of qubits 210a, 210b, 210g and 210h are arranged at an angular deviation to the respective major or longitudinal axis of the qubits 210a, 210b, 210g and 210h, respectively. A person of skill in the art will appreciate that in alternate embodiments, qubits 220c, 220f, 210c and 210f may be arranged at an angular deviation similar to qubits 220a, 220b, 220g, 220h, 210a, 210b, 210g and 210h such that qubits 220c and 220f may be communicatively coupled to a respective qubit in the same set of qubits (i.e., second set of qubits) and qubits 210c and 210f may be communicatively coupled to a respective qubit in the same set of qubits (i.e., first set of qubits). Furthermore, in alternative embodiments, the angular deviation of certain qubits in unit cell 200 such as qubits 210a and 210b may be arranged anywhere within or outside unit cell 200.

Examples of superconducting qubits include superconducting flux qubits, superconducting charge qubits, and the like. See e.g., Makhlin et al., 2001, *Reviews of Modern Physics* 73, pp. 357-400. Examples of flux qubits that may be used include rf-SQUIDs, which include a superconducting loop interrupted by one Josephson junction, persistent current qubits, which include a superconducting loop interrupted by three Josephson junctions, and the like. See e.g., Mooij et al., 1999, *Science* 285, 1036; and Orlando et al., 1999, *Phys. Rev.* B 60, 15398. Other examples of superconducting qubits can be found, for example, in Il'ichev et al., 2003, *Phys. Rev. Lett.* 91, 097906; Blatter et al., 2001, *Phys. Rev. B* 63, 174511, and Friedman et al., 2000, *Nature* 406, 43. In addition, hybrid charge-phase qubits may also be used.

As previously described, coupling devices such as coupling devices 230a-230d (collectively 230) may provide pair-wise communicative coupling between respective pairs of qubits 210 and/or 220. Specifically, coupling device 230a provides communicative coupling between a horizontal qubit 210a and a vertical qubit 220a at a region proximate where the horizontal qubit 210a and the vertical qubit 220a cross one another, coupling device 230b provides communicative coupling between a pair of horizontal qubits 210a and 210b at a region proximate where the horizontal qubits 210a and 210b cross one another, and coupling device 230c provides communicative coupling between a pair of vertical qubits 220a and 220b at a region proximate where the vertical qubits 220a and 220b cross one another. Each coupling device 230 may be a respective loop of superconducting material interrupted by at least one respective Josephson junction. Coupling devices 230 may be tunable as described in, for example U.S. Pat. Nos. 7,619,437, 7,969,805 and 7,898,282, etc. in that the coupling created between two respective qubits by coupling devices 230 may be changed during the operation of a quantum processor.

Unit cell 200 may be laid out into an integrated circuit. The integrated circuit may be multi-layered. There may be at least two layers of metal in the integrated circuit. At least a portion of each qubit 210 may be laid out in a first metal layer of the integrated circuit. At least a portion of each qubit 220 may be laid out in a second metal layer of the integrated circuit. For example, horizontal qubit 210a and vertical qubit 220a may both be laid out in the first metal layer and a portion of qubit 220a may briefly change layers (i.e., switch to the second metal layer) to tunnel under or bridge over qubit 210a at an approximate position where qubit 220a crosses qubit 210a. Alternatively, a portion of qubit 210a may briefly change layers (i.e., switch to the second metal layer) to tunnel under or bridge over qubit 220a at an approximate position where qubit 220a crosses qubit 210a.

At least a portion of each coupling device may be laid out in the first metal layer and/or the second metal layer and/or a third metal layer. The third metal layer may be interposed between the first metal layer and the second metal layer. For example, coupling devices 230 may exist in the first, second or third metal layer or in the first and second, second and third or first and third metal layers or the first, second and third metal layers. Vias may be used within qubits 210, 220 and/or coupling devices 230 to electrically connect any or all of the first, second and third metal layers together. Further details of vias that electrically couple multiple metal layers in a superconducting integrated circuit are described in, for example, U.S. Patent Publication 2011-0089405.

On-chip control circuitry may be laid out efficiently within areas within the unit cell defined by the qubits 210 and 220. Examples of on-chip control circuitry can be found in U.S. Pat. Nos. 7,876,248, 8,098,179, 7,843,209, 8,018,244, 8,169,231 and U.S. Patent Publication 2012-0094838.

Figure 3:
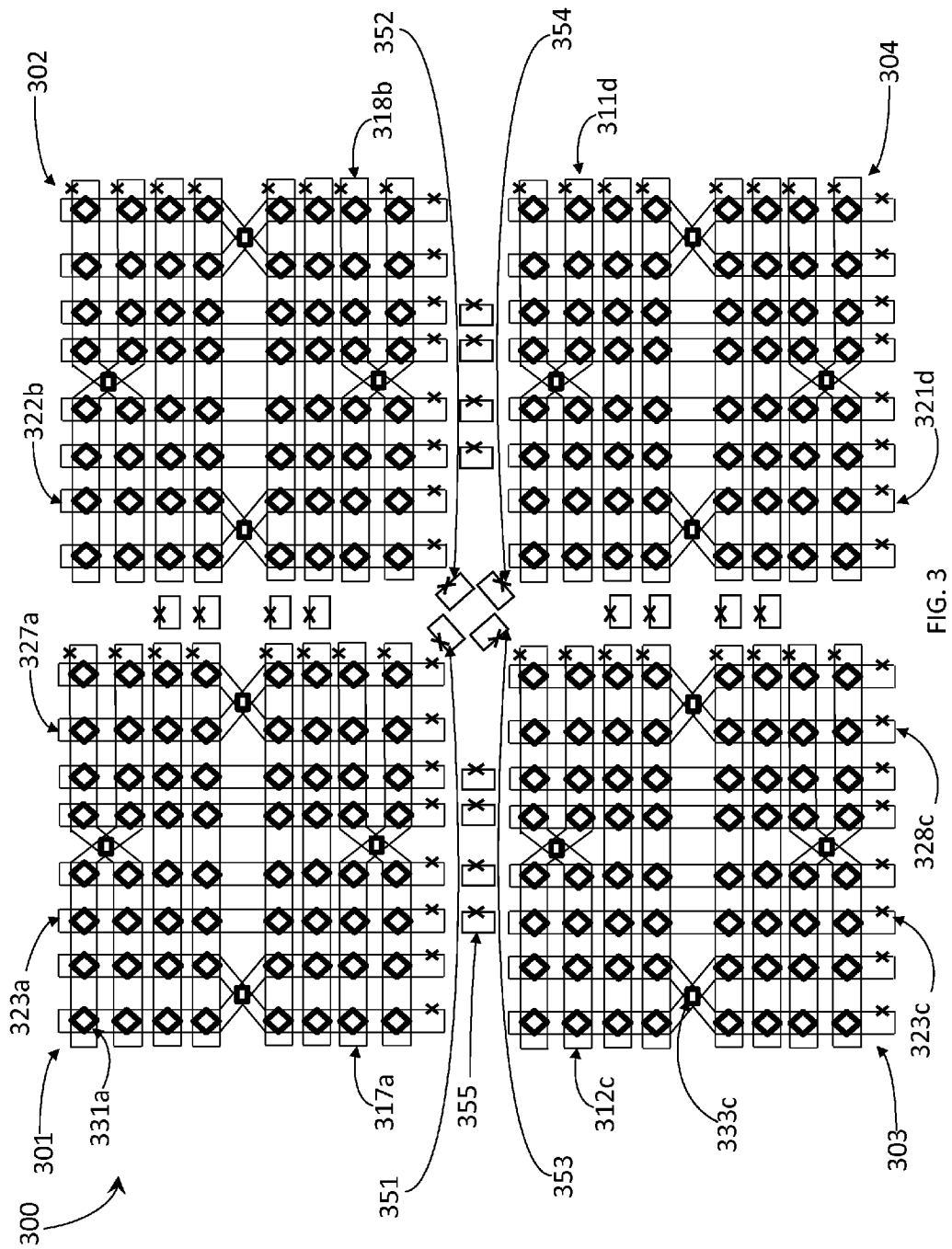
FIG. 3 is a schematic diagram of a quantum processor architecture based on FIG. 2.

Tiling unit cells of qubits across an area of the quantum processor forms the basis of the processor architecture. FIG. 3 shows a quantum processor architecture 300 based on for example unit cell 200 of FIG. 2. Architecture 300 may be a portion of a quantum processor comprised of a plurality of unit cells (referred to as "subtopologies" in U.S. Pat. No. 8,421,053) tiled over an area such that each unit cell is positioned adjacent at least one other unit cell. Architecture 300 comprises unit cells 301, 302, 303, 304. Each unit cell comprises horizontal and vertical qubits (e.g., horizontal qubits 317a, 318b, 312c, 311d and vertical qubits 327a, 322b, 328c, 321d), a first set of intra-cell coupling devices which communicatively couple qubits in the same unit cell where a horizontal and vertical qubit crosses (e.g., coupling device 331a), a second set of intra-cell coupling devices which communicatively couple qubits in the same unit cell where a pair of horizontal qubits or a pair of vertical qubits crosses (e.g., coupling device 333c) and a set of inter-cell coupling devices where a pair of qubits (i.e., two horizontal qubits, two vertical qubits or a horizontal and a vertical qubit) of different unit cells are communicatively coupled together (e.g., coupling devices 351, 352, 353, 354, 355). In some implementations, the unit cells are repeatable or repeated sub-portions of a quantum processing comprising at least two sets of qubits and couplers, where at least one qubit of a first set crosses at least one, and typically all, of the qubits of a second set in the unit cell. Notably, on a single processor device or wafer, none of the loops of the qubits that comprise one unit cell cross any of the loops of the qubits that comprise any other unit cell.

In the illustrative example of FIG. 3, each unit cell 301, 302, 303, 304 comprises sixteen qubits, eight of which are laid out in a first set of qubits and eight of which are laid out in a second set of qubits such that all of unit cells 301, 302, 303, 304 contained within architecture 300 are substantially similar to one another (i.e., respective 8-by-8 arrays of qubits). In architecture 300, inter-cell interaction or communicative coupling is established by coupling between some qubits placed immediately adjacent each other in different unit cells, as well as coupling between qubits placed proximally adjacent each other in diagonally adjacent unit cells. Again, the structure is explained using the terms horizontal qubits and vertical qubits for ease of discussion. Such is not intended to be limiting, but rather to conveniently refer to a first set of nominally parallel (i.e., longitudinal or major axes do not cross) qubits and a second set of nominally parallel qubits. As illustrated, vertical qubit 323a of unit cell 301 and vertical qubit 323c of unit cell 303 are communicatively coupled together via coupling device 355. Coupling device 351 may communicatively couple horizontal qubit 318b of unit cell 302 and vertical qubit 328c of unit cell 303 together. Similarly, coupling device 352 may communicatively couple horizontal qubit 317a of unit cell 301 and vertical qubit 321d unit cell 304 together, coupling device 353 may communicatively couple vertical qubit 327a of unit cell 301 and horizontal qubit 311d of unit cell 304 together, and coupling device 354 may communicatively couple vertical qubit 322b of unit cell 302 and horizontal qubit 312c of unit cell 303 together. Qubits such as qubits 317a and 321d may be elongated further to arrange qubit 317a immediately adjacent qubit 321d such that coupling device 352 may communicatively couple qubits 317a and 321d together. Such coupling between qubits in horizontally, vertically and diagonally adjacent unit cells may allow a unit cell in architecture 300 to interact with a maximum of eight other unit cells.

Another feature of architecture 300 is that, as previously described, an angular deviation between some qubits in a unit cell allows a pair of qubits in the same set of qubits in the unit cell (e.g., a pair of horizontal qubits in the same unit cell or a pair of vertical qubits in the same unit cell) to cross one another and communicatively couple to one another by a coupling device. Therefore, a much stronger interaction within qubits in a unit cell may be realized with increased number of inter-cell interactions. Such architecture as shown in FIG. 3 may be used advantageously to solve different types of problems such as factoring, constraint satisfaction, etc. The architecture illustrated in FIG. 3 may be particularly well-suited for factoring as factoring problems may benefit from chains of qubits which are connected in the diagonal, horizontal and vertical directions without interference with each other.

Figure 4:
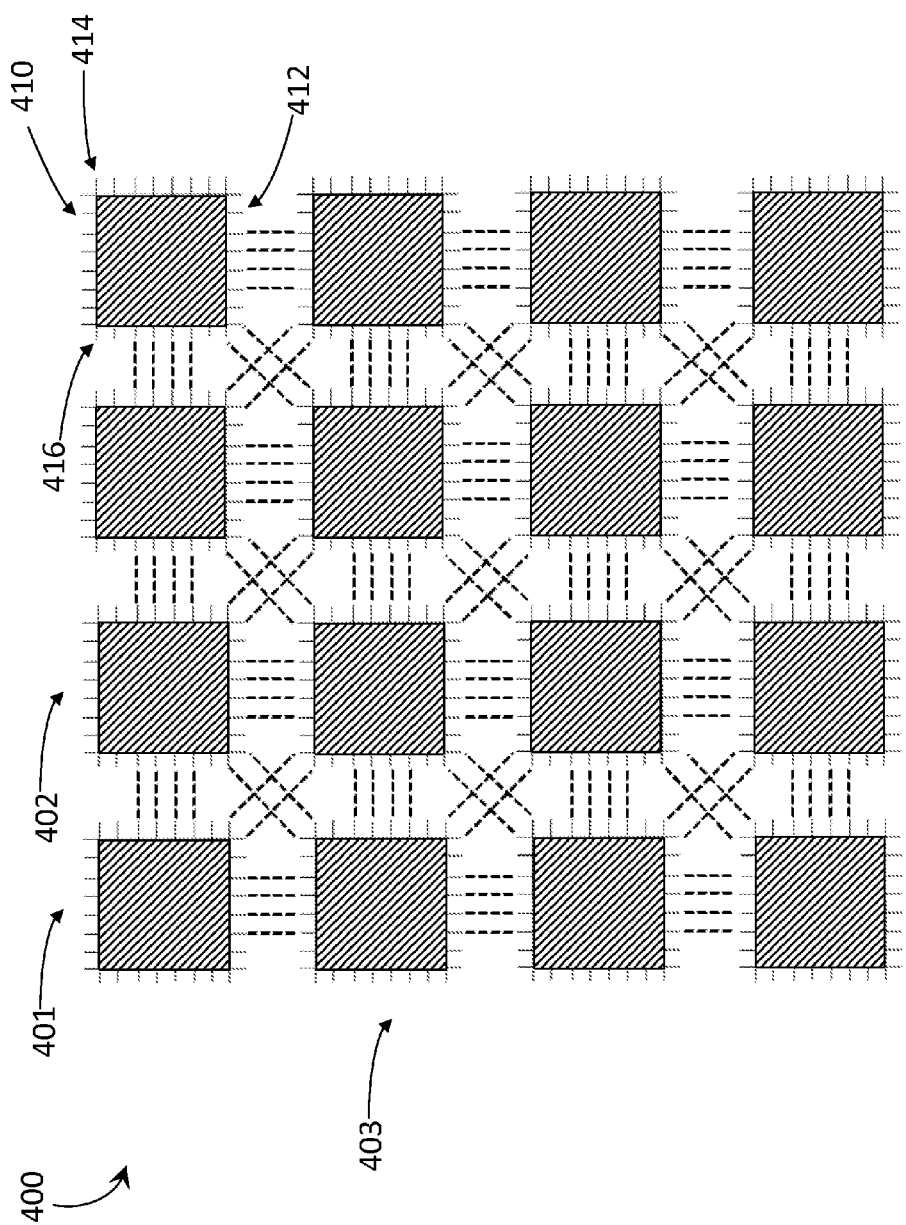
FIG. 4 is a schematic diagram of a quantum processor architecture illustrating the interconnections realized between the unit cells in the quantum processor architecture from FIG. 3, in accordance with the present systems and devices.

FIG. 4 is a schematic diagram of quantum processor architecture 400, illustrating the interconnections or communicative couplings realized between the unit cells in a quantum processor architecture, such as quantum processor architecture 300 from FIG. 3, in accordance with the present systems and devices. Architecture 400 comprises unit cells 401, 402, 403, each illustrated as a hatched square including solid line extensions in FIG. 4. The solid lines extending out from each hatched square represent portions of qubits in the unit cell located closest to the periphery of the unit cell. For example, portions 410 and 412 represent portions of a qubit of a first set of qubits. Portions 410 and 412 may be portions of the same qubit, or portions of different qubits (e.g., in the case where two qubits of the same set of qubits are arranged at an angular deviation such that the qubits cross each other). Portions 414 and 416 represent portions of a qubit of a second set of qubits. Portions 414 and 416 may be portions of the same, or of different qubits. The hatched square is a schematic representation of an arrangement of qubits and couplers in the respective unit cell.

Only unit cells 401, 402, 402 are called out in FIG. 4 to reduce clutter. Each unit cell 401, 402, 403 may represent a respective unit cell 301, 302 and 303 from architecture 300. The broken lines in FIG. 4 represent inter-cell couplings that may be established between qubits in adjacent unit cells by inter-cell coupling devices. Inter-cell couplings may be established between horizontally adjacent unit cells, vertically adjacent unit cells and/or diagonally adjacent unit cells. As illustrated, unit cell 401 is positioned immediately next to unit cell 402 in a horizontal direction with no other unit cells in between, thereby making unit cells 401 and 402 horizontally adjacent. Unit cell 401 is positioned immediately next to unit cell 403 in a vertical direction with no other unit cells in between, thereby making unit cells 401 and 403 vertically adjacent. Unit cell 402 is positioned immediately next to unit cell 403 in a diagonal direction with no other unit cells in between, thereby making unit cells 402 and 403 diagonally adjacent. As shown in quantum processor architecture 400, a unit cell may interact with eight other unit cells placed horizontally adjacent, vertically adjacent and diagonally adjacent by inter-cell coupling, except for those unit cells located at the peripheries of quantum processor architecture 400, which may have fewer adjacent unit cells. Those of skill in the art will appreciate that this assignment of vertical, horizontal and diagonal directions is arbitrary, used as a convenient notation, and not intended to limit the scope of the present systems and devices in any way.

Respective qubits of two horizontally adjacent unit cells may be directly communicatively coupled via a respective single coupler. Respective qubits of two vertically adjacent unit cells may be directly communicatively coupled via a respective single coupler. Respective qubits of two diagonally adjacent unit cells may be directly communicatively coupled via a respective single coupler.

Figure 5:
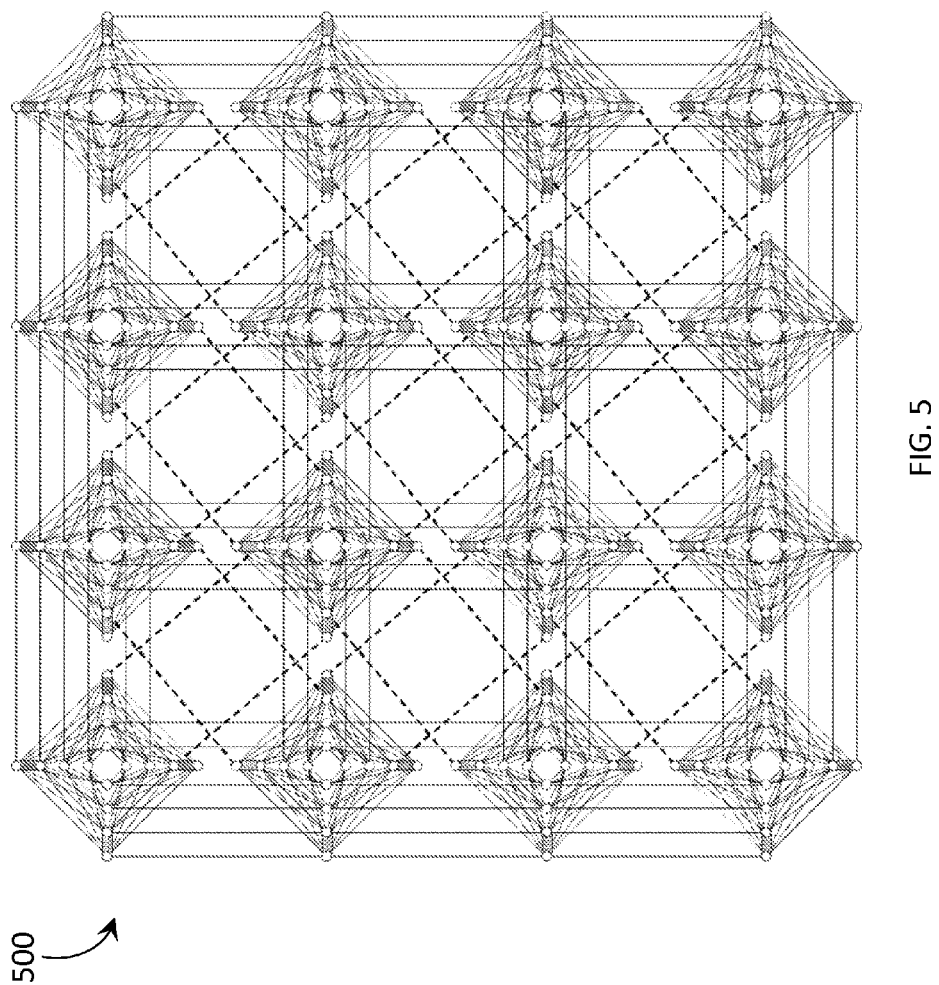
FIG. 5 is a qubit graph illustrating the interconnections realized between the qubits in the quantum processor architecture from FIG. 2, in accordance with the present systems and devices.

FIG. 5 shows a qubit graph 500 illustrating the interconnections realized between the qubits in quantum processor architecture 300 from FIG. 3, in accordance with the present systems and devices. Graph 500 also includes vertices and edges. As shown herein, each vertex is a white dot outlined by a black border. Each vertex also corresponds to a qubit. Each diamond shaped sub-graph is a unit cell including a bi-partite graph of type and size $K_{8,8}$ (i.e., an 8-by-8 unit cell). The solid lines that join the vertices within each diamond shaped sub-graph are a first set of intra-cell couplers which may communicatively couple between qubits arranged at orthogonal directions (i.e., first set of qubits and second set of qubits of the same unit cell). The shaded edges are intra-cell couplers which communicatively couple a pair of qubits in the set of qubits in the same unit cell (e.g., coupling device 230c communicatively couples qubit 220a and 220b together as shown in FIG. 2 where a portion of each qubit 220a, 220b is fabricated and/or arranged with an angular deviation that may allow qubit 220a and qubit 220b to cross each other).

A notable aspect of the present systems and methods is the presence of odd-cycles in the qubit graph. A cycle may be defined by a sequence of vertices starting and ending at the same vertex with traversing by edges. A qubit may be represented by a vertex and a coupler may be represented by an edge. A cycle's length may be the number of edges or equivalently, the number of vertices in the cycle. For example, in FIG. 2, a pair of qubits running in the same direction (i.e., in the same set of qubits in the unit cell) having a coupling between them, as indicated by an intra-cell coupling device, is also coupled to eight other qubits running in the perpendicular direction. This creates eight instances of cycles each with a length of 3 (also referred to herein as "3-cycles") starting and ending with one of the qubits in the pair. An example of a 3-cycle is found in FIG. 2 within unit cell 200. Qubit 210a is communicatively coupled to qubit 220a by coupling device 230a. Qubit 220a is communicatively coupled to qubit 220b via coupling device 230c at their diagonal portions. Qubit 220b is communicatively coupled to qubit 210a via coupling device 230d, thus forming a 3-cycle.

Those of skill in the art will recognize that odd cycles of lengths greater than 3 may also be present. The possible lengths of the odd cycles may depend on the number of qubits present in a unit cell and thus in the architecture. Such odd-cycles may be advantageous for certain instances of embedding a problem into the quantum processor comprising qubits and coupling devices (for example, to create frustration between communicatively coupled qubits). Such odd-cycles are possible due to the presence of the intra-cell couplers described herein, which allow for pairs of qubits in the same set of qubits of the same unit cell to be communicatively coupled. Odd-cycles not seen in for example, U.S. Pat. No. 8,421,053, as no edge or coupler exists between qubits within the same set of qubits in the same unit cell.

Another feature of the present systems and methods is the introduction of increased connectivity in a unit cell without increasing the number of coupling devices required to achieve such a level of connectivity. Simply adding a coupling device to communicatively couple a pair of qubits of the same set of qubits in a unit cell comprising a quantum processor, such as the quantum processor described in U.S. Pat. No. 8,421,053, would increase the total number of coupling devices in the quantum processor. A larger number of total coupling devices may increase the difficulty required to physically fabricate the additional couplers, potentially resulting in reduced production quality. However, the total number of coupling devices need not increase in for example, the quantum processor architecture 300 of FIG. 3 despite the addition of four additional intra-cell coupling devices in each unit cell. The presence of the intra-cell coupling devices 351, 352, 353 and 354 in conjunction with the intra-cell coupling devices (e.g., coupler 331a) may render some inter-cell couplings between a pair of qubits in the same sets of qubits in horizontally or vertically adjacent unit cells unnecessary, thus fewer inter-cell couplers may be used.

However, it is notable that in a quantum processor, intra-cell coupling devices which communicatably couple a pair of qubits in the same set of qubits in the same unit cell (e.g., coupling device 331a) may be used independently of inter-cell couplers which communicatively couple a pair of qubits in diagonally adjacent unit cells (e.g., coupling device 351).

The present systems and devices are not limited to the quantum processor architecture shown in FIG. 2. Various different quantum processor architectures may be achieved by modifying a unit cell to enable interactions or communicative coupling between the same and other unit cells and therefore the quantum processor architecture may be implemented in many different ways. For example, by changing the qubits in the same set of qubits of a unit cell that may be communicatively coupled by a coupling device in the second set of intra-cell coupling devices and/or by changing the position of a pair of qubits in the same set of qubits in a unit cell that may cross one another, such as coupling a pair of qubits in the same set of qubits of a single unit cell at a corner of the unit cell rather than inside the area of the unit cell, many different quantum processor architectures may be achieved. The different architectures may be useful in solving different types of problems so that a certain problem that may be more difficult to solve using a certain quantum processor architecture may be more easily and/or efficiently solved by embedding the problem into a different architecture with qubit interactions that better suit the particular problem.

Throughout this specification and the appended claims, the term "superconducting" when used to describe a physical structure such as a "loop of superconducting material" is used to indicate a material that is capable of behaving as a superconductor or that exhibits superconducting properties at an appropriate temperature. A superconducting material may not necessarily act as a superconductor at all times in all embodiments of the present systems and devices.

As described herein, a vertical qubit (e.g., vertical qubit 220a of FIG. 2) may be a qubit where a portion of the qubit is positioned parallel to a respective longitudinal axis in the vertical direction such that most of the length spanned by the qubit may be parallel to the vertical direction (for example, more than 50% of the length spanned by the qubit). A vertical qubit may also comprise a second portion fabricated with an angular deviation to the vertical direction or axis that may allow another vertical qubit with a substantially similar angular deviation to cross. Similarly, a horizontal qubit (e.g., horizontal qubit 210a of FIG. 2) may be a qubit where a portion of the qubit is positioned parallel to a respective longitudinal axis in the horizontal direction such that most of the length spanned by the qubit may be parallel to the horizontal direction (for example, more than 50% of the length spanned by the qubit). A horizontal qubit may also comprise a second portion fabricated with an angular deviation to the horizontal direction or axis that may allow another horizontal qubit with a substantially similar angular deviation to cross. Furthermore, those of skill in the art will appreciate that the term "parallel" is used loosely in this specification and that any "parallel qubits" may be slightly off-parallel, for instance in accordance with typical manufacturing or fabrication tolerances.

Within a unit cell, the respective longitudinal axis of a portion of each qubit in a first set of qubits (e.g., qubits 210a-210h) may be perpendicular to the respective longitudinal axis of a portion of each qubit in a second set of qubits (e.g., qubits 220a-220h) such that each qubit in the first set may perpendicularly cross at least one qubit in the second set. Those of skill in the art will appreciate that the terms "perpendicular" and variations thereof, such as "perpendicularly," are used loosely in this specification and that, for example, the angle between the respective longitudinal axis of each qubit in a set of qubits and the respective longitudinal axis of each qubit in another set of qubits may be around but not exactly 90 degrees (i.e., slightly off-perpendicular).

The longitudinal axis of a qubit may be an axis that runs parallel to a portion of the qubit along the elongated direction of the qubit that spans most of the length of the qubit (for example, more than 50% of the length of the qubit). The transverse axis of a qubit may be an axis that runs perpendicular, orthogonal, normal, and/or at 90 degrees to the longitudinal axis of the qubit. The elongated direction of a qubit may be the direction of the qubit that is parallel to the largest dimension spanned by the qubit.

Throughout this specification and the illustrated embodiments, the qubits are generally represented as elongated essentially straight loops. However, those of skill in the art will appreciate that the qubits may not always be straight and can be essentially curvy such as elongated serpentine loops (for example, qubit 220*a* of FIG. 2). A curvy or serpentine loop may, for example, be elongated along a direction that is parallel to a longitudinal axis, which may allow the respective longitudinal axes of multiple curvy or serpentine loops to cross one another at a given point.

A qubit in a first set may cross a qubit in a second set of the same unit cell or a qubit in one set may cross a qubit in the same set of a unit cell by overlying/underlying at least a portion of the qubit in the second set or the same set respectively. Which one is actually said to "cross" the other is arbitrary, and used in a relative sense. When a first qubit crosses a second qubit, it is to be understood that the second qubit may also be considered to cross the first qubit. A qubit in a first set may cross a qubit in a second set of the same or an adjacent unit cell where a portion of the qubit in the first set overlaps a portion of the qubit in the second set, for instance as projected from one plane or layer of a die to another plane or layer of the die in an orthogonal direction. For example, qubit 220*a* of FIG. 2 overlaps qubit 210*a*. Since both qubits 220*a* and 210*a* are in the same unit cell (i.e., unit cell 200), an intra-cell coupling device of a first set of intra-cell coupling devices is placed proximate the region where qubits 220*a* and 210*a* cross in order to communicatively couple qubits 220*a* and 210*a* together. Similarly, qubit 220*a* of FIG. 2 overlaps qubit 220*b*. Since both qubits 220*a* and 220*b* are in the same unit cell (i.e., unit cell 200) and in the same set of qubits (i.e., vertical qubits), an intra-cell coupling device of a second set of intra-cell coupling devices is placed proximate the region where qubits 220*a* and 220*b* cross in order to communicatively couple qubits 220*a* and 220*b* together.

A set of inter-cell coupling devices may be positioned between a pair of qubits in the same or different set of qubits in adjacent unit cells and may provide controllable communicative coupling between the respective pair of qubits in the same or different set of qubits in adjacent unit cells. Throughout the specification and the appended claims, the word "proximate" is used to describe the position of a coupling device. In this context, the term "proximate" is intended to mean "sufficiently proximate so as to communicatively couple to" the respective qubits between which the coupling device provides communicative coupling. A coupling device may be positioned in a region where two qubits may be communicatively coupled together such that the coupling device may provide antiferromagnetic, ferromagnetic, zero or transverse coupling between the qubits. Furthermore, the word "adjacent" when used in the context of the present systems and devices, is generally intended to mean "proximally adjacent" or "alongside" in the sense that adjacent unit cells or components thereof may not be in physical contact with one another.

It should be noted that many other architectures may be created by varying the coupling between qubits. As such, the invention is not restricted to the illustrative quantum processor architectures presented in the present specification and figures.

The various embodiments described above can be combined to provide further embodiments. To the extent that they are not inconsistent with the specific teachings and definitions herein, all of commonly assigned the U.S. patents, U.S. patent application publications, U.S. patent applications, referred to in this specification and/or listed in the Application Data Sheet including but not limited to: U.S. provisional patent application Ser. No. 61/863,360; U.S. provisional patent application Ser. No. 61/983,370; and U.S. patent application Ser. No. 14/453,883, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum processor comprising:
    a plurality of unit cells tiled over an area such that each unit cell is positioned adjacent to at least one other unit cell, each unit cell comprising:
        a first set of qubits and a second set of qubits, each qubit in the first set and the second set of qubits comprising:
            a respective loop of material that is superconductive at a critical temperature; and
            at least one respective Josephson Junction that interrupts the loop of material, wherein a first portion of the loop of material of a first qubit in the first set of qubits is oriented at an angle greater than zero degrees and less than ninety degrees to at least a portion of the loop of material of at least one qubit in the second set of qubits, the first qubit in the first set of qubits crossing at least one qubit in the second set of qubits, and the first portion of the first qubit in the first set of qubits crossing at least one other qubit in the first set of qubits;
        a first set of intra-cell coupling devices, wherein each coupling device in the first set of intra-cell coupling devices is positioned proximate a respective point where a respective one of qubits in the first set of qubits crosses one of the qubits in the second set of qubits and provides controllable communicative coupling between the qubit in the first set of qubits and the respective qubit in the second set of qubits; and
        a second set of intra-cell coupling devices, wherein each coupling device in the second set of intra-cell coupling devices is positioned proximate a respective point at which each at least one qubit in the first set of qubits crosses the at least one other qubit in the first set of qubits and provides controllable communicative coupling between the at least one qubit in the first set of qubits and the at least one other qubit in the first set of qubits.

2. The quantum processor of claim 1 wherein each unit cell is positioned horizontally adjacent, vertically adjacent, and/or diagonally adjacent at least one other unit cell.

3. The quantum processor of claim 2 wherein each unit cell is positioned adjacent at least three other unit cells such that each unit cell is positioned horizontally adjacent at least one other unit cell, vertically adjacent at least one other cell, and diagonally adjacent at least one other cell.

4. The quantum processor of claim 1 wherein the qubits in the second set of qubits are parallel to one another, the first qubit in the first set of qubits comprising the first portion oriented at an angle greater than zero degrees and less than ninety degrees to the qubits in the second set of qubits, and at least one other portion oriented perpendicular to the qubits in the second set of qubits, the first portion crossing the at least one other qubit in the first set of qubits.

5. The quantum processor of claim 1, further comprising an inter-cell coupling device positioned between a pair of qubits, a first member qubit of the pair of qubits in a first unit cell, and a second member qubit of the pair of qubits in a second unit cell, the inter-cell coupling device which provides controllable communicative coupling between the pair of qubits.

6. The quantum processor of claim 5 wherein the second unit cell is adjacent to the first unit cell.

7. The quantum processor of claim 6 wherein the second unit cell is horizontally or vertically adjacent to the first unit cell.

8. The quantum processor of claim 6 wherein the second unit cell is diagonally adjacent to the first unit cell.

9. The quantum processor of claim 1 wherein, in each unit cell, the first set of qubits includes at least four qubits and the second set of qubits includes at least four qubits, such that the unit cell includes at least eight qubits.

10. The quantum processor of claim 1 wherein each of the coupling devices of the first set of intra-cell coupling devices is positioned to selectively directly inductively couple a respective one of the qubits of the first set of qubits with a respective one of the qubits of the second set of qubits; and
each of the coupling devices of the second set of intra-cell coupling devices positioned to selectively directly inductively couple a respective one of the qubits of the first set of qubits with a respective another one of the qubits of the first set of qubits.

11. The quantum processor of claim 10, further comprising:
a third set of intra-cell coupling devices, each of the couplers of the third set of intra-cell coupling devices positioned to selectively directly inductively couple a respective one of the qubits of the second set of qubits with a respective another one of the qubits of the second set of qubits.

12. The quantum processor of claim 1 wherein the quantum processor comprises a multi-layered integrated circuit.

13. The quantum processor of claim 12 wherein the quantum processor comprises a superconducting quantum processor and the multi-layered integrated circuit comprises a multi-layered superconducting integrated circuit.

* * * * *